(12) United States Patent
Schuster

(10) Patent No.: US 7,764,427 B2
(45) Date of Patent: Jul. 27, 2010

(54) MICROLITHOGRAPHY OPTICAL SYSTEM

(75) Inventor: Karl-Heinz Schuster, Koenigsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 827 days.

(21) Appl. No.: 11/614,536

(22) Filed: Dec. 21, 2006

(65) Prior Publication Data

US 2007/0195411 A1    Aug. 23, 2007

Related U.S. Application Data

(60) Provisional application No. 60/775,371, filed on Feb. 21, 2006.

(51) Int. Cl.
    *G02B 5/30*      (2006.01)
(52) U.S. Cl. .................. 359/500; 359/494; 359/499; 359/352; 252/585; 355/71
(58) Field of Classification Search .................. None
See application file for complete search history.

(56) References Cited

U.S. PATENT DOCUMENTS

| | | | |
|---|---|---|---|
| 3,350,982 A * | 11/1967 | Marks | 353/20 |
| 6,963,448 B1 * | 11/2005 | Hayakawa | 359/494 |
| 7,375,897 B2 * | 5/2008 | Schuster | 359/649 |
| 2001/0019404 A1 | 9/2001 | Schuster et al. | |
| 2003/0168597 A1 | 9/2003 | Webb et al. | |
| 2004/0036985 A1 | 2/2004 | McGuire | |
| 2004/0150877 A1 | 8/2004 | Hogele et al. | |
| 2005/0243222 A1 | 11/2005 | Maul et al. | |
| 2006/0012885 A1 | 1/2006 | Beder et al. | |
| 2006/0146411 A1 * | 7/2006 | Schuster | 359/619 |
| 2006/0198029 A1 * | 9/2006 | Schuster | 359/649 |

FOREIGN PATENT DOCUMENTS

| | | |
|---|---|---|
| WO | 2005/059617 | 6/2005 |
| WO | 2005/059645 | 6/2005 |

OTHER PUBLICATIONS

E. G. Tsitsishvili "Sov. Phys. Semicond." 15 (10), Oct. 1981, pp. 1152-1154.

* cited by examiner

*Primary Examiner*—Arnel C Lavarias
(74) *Attorney, Agent, or Firm*—Fish & Richardson P.C.

(57) ABSTRACT

An optical system, such as, for example, an illumination system or a projection lens of a microlithographic exposure system. The optical system can have an optical axis and include at least one optical element that includes an optically uniaxial material having, for an operating wavelength of the optical system, an ordinary refractive index $n_o$ and an extraordinary refractive index $n_e$. The extraordinary refractive index $n_e$ can be larger than the ordinary refractive index $n_o$. The optical element can absorb, at least for light rays of the operating wavelength entering the optical element with respect to the optical axis under an angle of incidence that lies within a certain angle region, a p-polarized component of the light rays significantly stronger than a s-polarized component of the light rays.

29 Claims, 5 Drawing Sheets

MICROLITHOGRAPHY OPTICAL SYSTEM

CROSS-REFERENCE TO RELATED APPLICATION

This application claims priority under 35 U.S.C. §119(e)(1) to U.S. Ser. No. 60/775,371, entitled "OPTICAL SYSTEM, IN PARTICULAR ILLUMINATION SYSTEM OR PROJECTION LENS OF A MICROLITHOGRAPHIC EXPOSURE SYSTEM", and filed Feb. 21, 2006, which is hereby incorporated by reference.

BACKGROUND OF THE INVENTION

1. Field of the Invention

The disclosure relates to an optical system, such as, for example, an illumination system or a projection lens of a microlithographic exposure system.

2. Description of the Related Art

Microlithography is used in the fabrication of microstructured components like integrated circuits, LCD's and other microstructured devices. The microlithographic process is performed in a so-called microlithographic exposure system comprising an illumination system and a projection lens. The image of a mask (or reticle) being illuminated by the illumination system is projected, through the projection lens, onto a resist-covered substrate, typically a silicon wafer bearing one or more light-sensitive layers and being provided in the image plane of the projection lens, in order to transfer the circuit pattern onto the light-sensitive layers on the wafer.

In order to obtain a good interference contrast of the image created in the image plane of the projection lens, it can be desirable to have a two-ray-interference of light rays each being polarized perpendicular to the plane of incidence.

In the context of the present application, the polarization component that oscillates perpendicular to the plane of incidence of a light ray is referred to as s-polarized component, while the polarization component that oscillates parallel to the plane of incidence of a light ray is referred to as p-polarized component. Furthermore, a polarization distribution where the planes of oscillation of the electrical field vectors of individual linearly polarized light rays in a pupil plane of the system have an orientation that is perpendicular to the radius originating from the optical axis will hereinafter be referred to as tangential polarization. A polarization distribution where the planes of oscillation of the electrical field vectors of individual linearly polarized light rays in a pupil plane of the optical system have a radial orientation relative to the optical axis will hereinafter be referred to as radial polarization.

Various approaches to create an at least approximate tangential polarization distribution in an illumination system or a projection lens are known in the art. It is, however, a problem to bring (or "transport") such a once created tangential polarization state to the image plane of the projection lens, which is due to various depolarizing or polarization-modifying effects arising from e.g. the microstructures in the reticle, from phase shifts occurring at reflecting elements or from natural, intrinsic or stress-induced birefringence in the optical elements.

SUMMARY OF THE INVENTION

Optical systems, such as, for example, illumination systems or projection lenses of a microlithographic exposure system, are disclosed that have an enhanced interference contrast and an improved imaging quality.

According to one aspect, an optical system, such as an illumination system or a projection lens of a microlithographic exposure system, has an optical axis and includes at least one optical element that includes an optically uniaxial material having, for an operating wavelength of the optical system, an ordinary refractive index $n_o$ and an extraordinary refractive index $n_e$. The extraordinary refractive index $n_e$ is larger than the ordinary refractive index $n_o$. The optical element absorbs, at least for light rays of the operating wavelength entering the optical element with respect to the optical axis under an angle of incidence that lies within a certain angle region, a p-polarized component of the light rays significantly stronger than a s-polarized component of the light rays.

It is believed that, due to the higher extraordinary refractive index $n_e$ relative to the ordinary refractive index $n_o$ in the optical element, the refractive index that is seen by the p-polarized component (namely the extraordinary refractive index $n_e$) is larger than the refractive index seen by the s-polarized component (namely the ordinary refractive index $n_o$). The values of the extraordinary refractive index $n_e$ and the ordinary refractive index $n_o$ as well as the thickness of the optical element can be selected such that, for the wavelength being used and at least for the region of aperture angles, the optical element absorbs a significantly larger portion of the intensity of the p-polarized component compared to the s-polarized component. It is believed that, as a consequence, the optical element used in the inventive optical system can be particularly suited for providing an effective "refreshing" of a tangential polarization distribution by "removing", by means of absorption, at least most of the p-polarized component and transmitting at least most of the desired s-polarized component.

In some embodiments, the angle region comprises all incident angles with respect to the optical axis (OA) being larger than 60° (e.g., larger than 50°, larger than 40°).

As used herein, the p-polarized component of the light rays is regarded as to be absorbed significantly stronger than the s-polarized component of the light rays (i.e. the intensity of the p-polarized component being absorbed by the optical element is significantly higher than the intensity of the s-polarized component being absorbed by the optical element), if the relative portion of absorbed intensity is at least 50% higher for the p-polarized component if compared to the s-polarized component.

In certain embodiments, the optical element absorbs at least 90% (e.g., at least 95%, at least 98%) of the intensity of the p-polarized component.

In some embodiments, the optical element transmits at least 90% (e.g., at least 95%, at least 98%) of the s-polarized component.

In certain embodiments, the optical element is an at least substantially plan-parallel plate. It is believed that this makes it possible to have, at the light entrance side of the optical element, light ray bundles that are rotational symmetric with respect to a surface normal of the optical element and a rotationally symmetric influence on the s-and p-polarized components.

In some embodiments, the optical crystal axis of the optical element is at least substantially parallel to the optical axis of the optical system. As referred to herein, the optical axis of the optical system is a straight line or a sequence of straight line-sections which are passing the respective centre of curvature of the optical components of the optical system.

In order to achieve a uniform polarization distribution at the exit side of the optical element, it is believed that the optical element is desirably arranged at a position at which an optical path of the optical system is at least substantially telecentric. In other words, the optical element is advantageously arranged at a position where the light ray bundles are, at the entrance side of the optical element, with their respective central ray perpendicular to the entrance side of the optical element. In the context of the present application, a telecentric light path is a light path wherein the respective chief rays, i.e. those rays coming from an off-axis point in the object plane and crossing the optical axis in a pupil plane, are parallel to the optical axis of the optical system.

In some embodiments, the optical system includes at least one correction element that provides for an at least substantially telecentric light path within the optical element. The at least one correction element may be a refractive lens element and it may be in direct contact with the optical element. Furthermore, the correction element may have at least one optically effective surface that is aspheric.

In certain embodiments, a difference $n_e-n_o$ between the extraordinary refractive index $n_e$ and the ordinary refractive index $n_o$ is at least 0.15 (e.g., at least 0.20, at least 0.25).

In some embodiments, the uniaxial material includes an alkali earth metal or alkali metal as a first component and a chemical $N_3$-compound, a chemical NCN-compound or a chemical OCN-compound as a second component.

As to the combination of an alkali earth metal or alkali metal as a first component with a chemical $N_3$-compound, it is believed that the triple bond provided by the $N_3$-compound can result in an enhanced optical anisotropy of the material and, thereby, to the desired large difference between the extraordinary refractive index $n_e$ and the ordinary refractive index $n_o$. It is believed that this effect is at least partially maintained in the combination of an alkali earth metal or alkali metal with a chemical NCN-compound or a chemical OCN-compound, with an additionally improved handling of the material (considering an explosiveness of some $N_3$-compounds) due to substitution of one or two N-atoms by an O- or C-atom.

In certain embodiments, the uniaxial material is Sodium Cyanate (NaCNO), Henotim (Y[PO$_4$]), Bastnäsite ((Ce,La,Nd) [CO$_3$F]), Synchisite (CeCa[(CO$_3$)$_2$F], Parisite ((Ce,La)$_2$Ca[(CO$_3$)$_3$F$_2$]$^3$), Röntgenite (Ce$_3$Ca$_2$[(CO$_3$)$_5$F$_3$], [Pt(CN)$_4$] Mg.7H$_2$O, AgCN, AgK(CN)$_2$, Potassium Azid (KN$_3$), [NH$_4$]$_2$CO,), Calcium Cyanamide (CaCN$_2$) and/or BBO.

In some embodiments, the operating wavelength is less than 250 nm (e.g., less than 200 nm, less than 160 nm).

As has been explained above, the systems can be particularly suited for providing an effective "refreshing" of a tangential polarization distribution. In order to achieve such a refreshing without having much of intensity losses, it can be advantageous to perform the inventive refreshing at more than one suited positions (e.g., at a plurality of suited positions in the optical system). Accordingly, in certain embodiments, at least two (e.g., at least three, more than three) of the optical elements are provided at different predetermined positions in the optical system. In some embodiments, at least some (e.g., all) of the predetermined positions are positions at which an optical path of the optical system is at least substantially telecentric.

In certain embodiments, the optical system is an immersion system wherein a space between a last optical element of the optical system and an image plane of the optical system includes an immersion medium having a refractive index n larger than 1.

An image-side numerical aperture NA of the projection system can have a value of NA$\geq$0.8 (e.g., NA$\geq$1.2, NA$\geq$1.4).

Optionally, the systems can be in a microlithographic projection exposure apparatus and corresponding methods (e.g., to structure a substrate and a microstructured device).

Further aspects of the disclosure can be gathered from the following description and the appended claims.

BRIEF DESCRIPTION OF THE DRAWINGS

The disclosure is described in more detail with reference to the following detailed description and drawings, in which.

DETAILED DESCRIPTION

Figure 1:
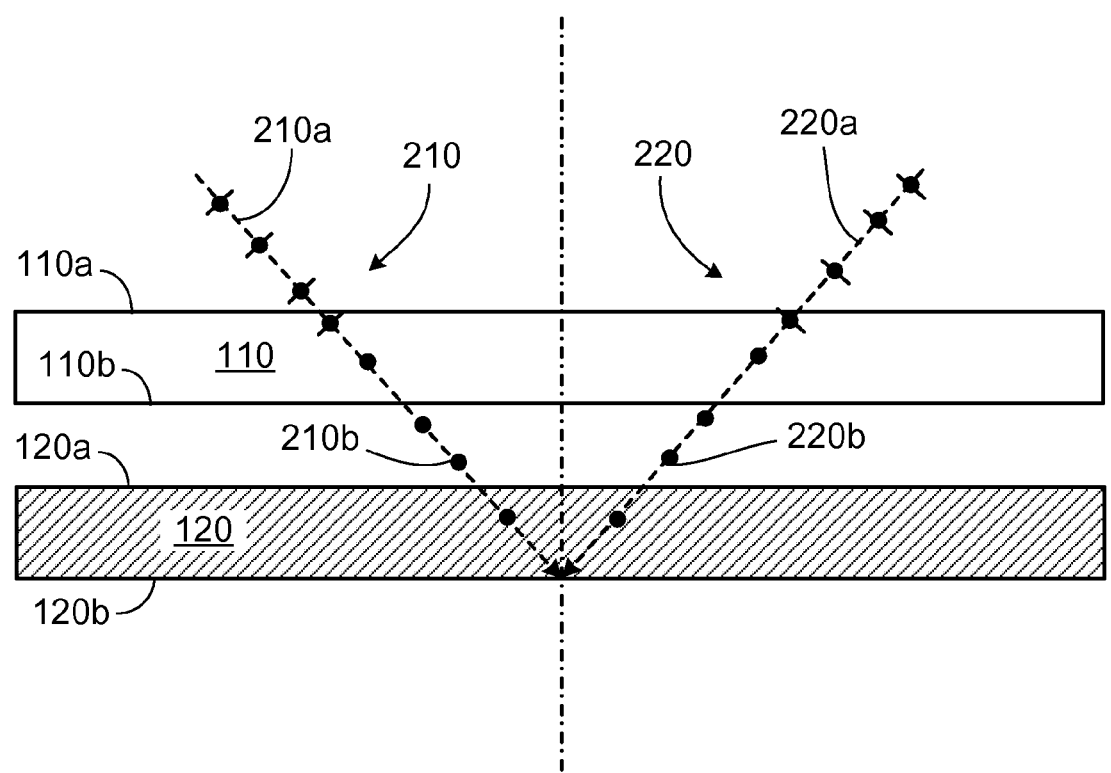
FIG. 1 is a schematic diagram depicting the effect of an optical element that is used according to the present invention.

FIG. 1 shows, in a typical arrangement according to the present invention, an optical element 110 and a reticle 120 in a microlithographic exposure system. The microlithographic exposure system, which is not illustrated in FIG. 1 but further explained below with respect to FIG. 6, comprises an illumination system and a projection lens, wherein the illumination system illuminates the reticle 120 with light from a light source, wherein the reticle 120 is arranged in the object plane of the projection lens, and wherein the projection lens images the reticle onto an image plane of the projection lens. The reticle 120 has a light entrance side 120a and a light exit side 120b and is bearing a circuit pattern (not illustrated in FIG. 1) on the light exit side 120b, and a wafer is provided in the image plane and is bearing one or more light-sensitive layers, so that the circuit pattern on the reticle 120 is transferred onto the light-sensitive layers on the wafer.

In some embodiments, the microlithographic exposure system uses, as a light source, an Argon-Fluoride (ArF) excimer laser generating a radiation having a wavelength of 193 nm (corresponding to the deep ultraviolet=DUV). However, other wavelengths than 193 nm, for example but not limited to 248 nm from a Krypton-Fluoride (KrF) excimer laser or 157 nm (from a F$_2$-laser), are also applicable.

Going back to FIG. 1, the optical element 110 is an at least substantially plan-parallel plate having a light entrance side 110a and a light exit side 110b and includes an uniaxial material having an ordinary refractive index $n_o$ and an extraordinary refractive index $n_e$, the extraordinary refractive index $n_e$ being larger than the ordinary refractive index $n_o$. In certain embodiments, a difference $n_e-n_o$ between the ordinary refractive index $n_o$ and the extraordinary refractive index $n_e$ is at least 0.15 (e.g., at least 0.20, at least 0.25). Accordingly, an effect of the optical element 110 is that the refractive index that is seen by the p-polarized component (namely the extraordinary refractive index $n_e$) is larger than the refractive index that is seen by the s-polarized component (namely the ordinary refractive index $n_e$) of a light ray passing the optical element 110.

Furthermore, the values of the extraordinary refractive index $n_e$ and the ordinary refractive index $n_o$ as well as the thickness of the optical element 110 are selected such that—for the respective wavelength being used—for light rays entering the optical element under an angle of incidence with respect to the optical axis OA lying within a certain angle region, the intensity of the p-polarized component being absorbed by the optical element 110 is significantly higher than the intensity of the s-polarized component being absorbed by the optical element 110. In some embodiments, the angle region covers at least incident angles with respect to the optical axis OA being larger than 60° (e.g., larger than 50°, larger than 40°).

The magnitude of the refractive index of a crystal material depends on the distance of the respective operating wavelength from the band edge in so far as the higher the refractive index, the smaller is the distance from the band edge. Furthermore, the extraordinary refractive index $n_e$ in an optically uniaxial material depends on the angle $\Theta$ to the optical crystal axis as follows:

$$n_e(\Theta) \frac{n_e * n_o}{\sqrt{n_0^2 * \sin^2\Theta + n_e^2 * \cos^2\Theta}} \quad (1)$$

Figure 2:
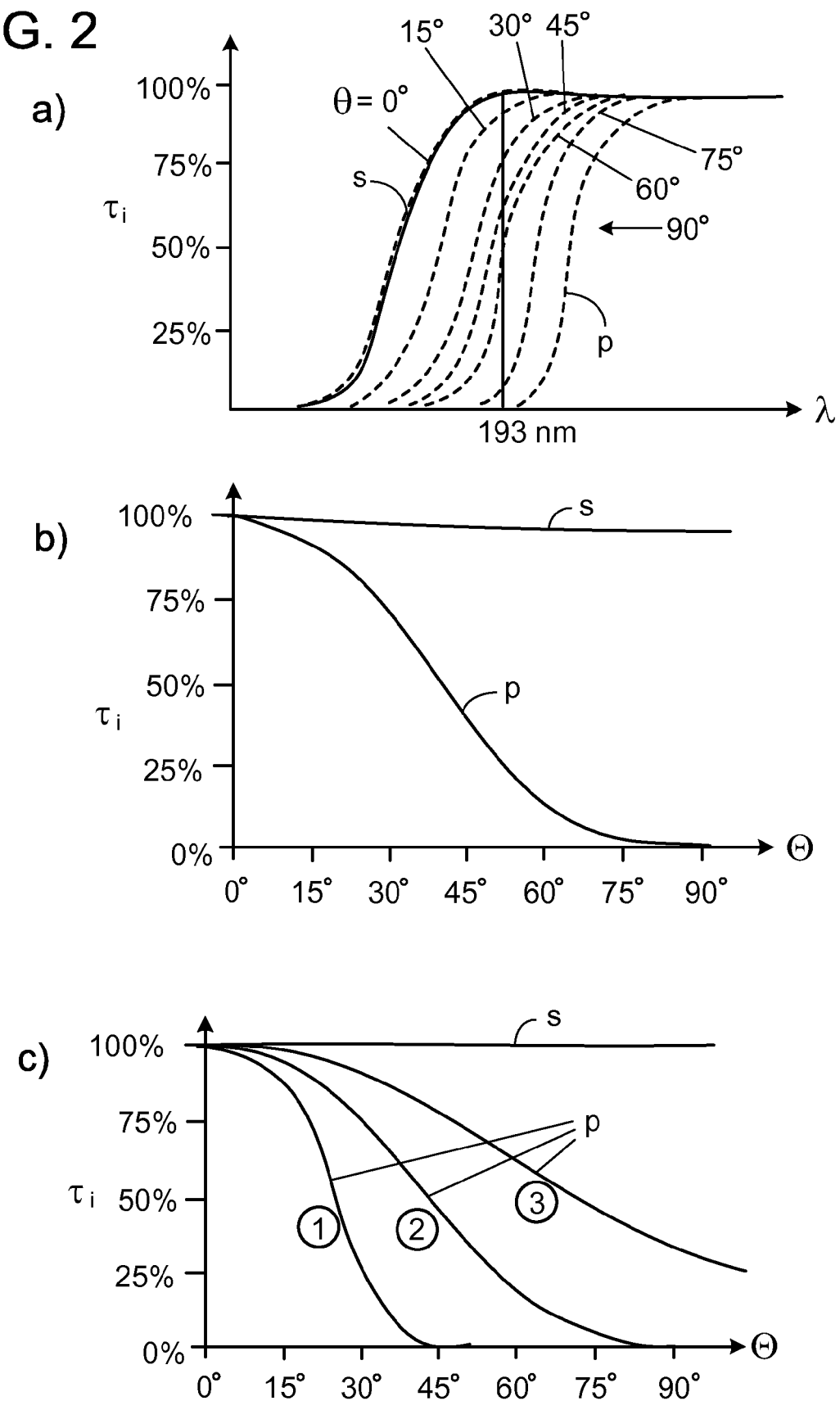
FIG. 2a-c are schematic diagrams that qualitatively show typical dependencies of the transmission coefficient on operating wavelength and aperture angles.

Accordingly, dependent on the angle $\Theta$ to the optical crystal axis, the transmission of the p-polarized component continuously changes, resulting in an increasing difference in transmission for the s- and p-polarized components, respectively. This is just qualitatively illustrated in FIG. 2a-c.

In FIG. 2a-c, typical wavelength-dependencies of the transmission coefficients $\tau_{ie}$ and $\tau_{io}$ for both the ordinary and the extraordinary ray are qualitatively illustrated, namely dependent on the wavelength $\lambda$ and for different angles $\Theta$ to the optical crystal axis (FIG. 2a), dependent on the angle $\Theta$ to the optical crystal axis for a constant wavelength (FIG. 2b) and dependent on the angle $\Theta$ to the optical crystal axis for a constant wavelength and for different magnitude of birefringence (FIG. 2c). The wavelength generated by the light source (i.e. the excimer laser) in the microlithographic system is assumed in FIG. 2a to be $\lambda_0$=193 nm.

In FIG. 2a, the wavelength-dependency of the transmission coefficients $\tau_{ie}$ for the extraordinary ray is illustrated with solid lines, whereas curves showing the wavelength-dependency of the $\tau_{io}$ for the ordinary ray and for different angles $\Theta$ to the optical crystal axis are illustrated with dashed lines. It can be seen that for larger angles $\Theta$, due to the optical anisotropy of the material used for the optical element 110, a strong decrease has occurred at the wavelength $\lambda_0$=193 nm in the transmission coefficient $\tau_{ie}$ (being relevant for the p-polarized component), whereas only a much smaller decrease has occurred in the transmission coefficient $\tau_{io}$ (being relevant for the s-polarized component). Consequently, and as can be qualitatively seen from FIG. 2b, for sufficiently high angles to the optical crystal axis, a significant portion of the p-polarized component is absorbed, while at least most of the s-polarized component is transmitted. This effect increases with enhanced birefringence (i.e. increasing difference between the extraordinary refractive index $n_e$ and the ordinary refractive index $n_o$), as can be seen from FIG. 2c qualitatively showing curves for a material with very large birefringence (curve I), with large birefringence (curve II) and with medium birefringence (curve III). With other words, with increasing birefringence of the material, the desired effect of absorption of a significant portion of the p-polarized component is achieved over an increasing range of angles to the optical crystal axis covering more and more also the region of medium and lower aperture angles.

Suitable raw materials for the manufacturing of the optical element are listed by way of example, and without limitation of the present invention to these examples, in the following table 1; together with these materials, the respective values of the ordinary refractive index $n_o$ and the extraordinary refractive index $n_e$ are given for a wavelength of $\lambda$=589 nm:

TABLE 1

| Material | $n_o$ | $n_e$ |
| --- | --- | --- |
| Sodium cyanate (NaCNO) | 1.389 | 1.627 |
| Henotim (Y[PO$_4$]) | 1.7207 | 1.8155 |
| Bastnäsite ((Ce,La,Nd)[CO$_3$F]) | 1.7225 | 1.8242 |
| Synchisite (CeCa[(CO$_3$)$_2$F] | 1.6730 | 1.7690 |
| Parisite ((Ce,La)$_2$Ca[(CO$_3$)$_3$F$_2$]$^3$) | 1.6717 | 1.7712 |
| Röntgenite (Ce$_3$Ca$_2$[(CO$_3$)$_5$F$_3$] | 1.662 | 1.756 |
| Potassium azid (KN$_3$) | 1.410 | 1.656 |
| [NH$_4$]$_2$CO | 1.481 | 1.594 |
| [Pt(CN)$_4$]Mg•7H$_2$O | 1.5608 | 1.91 |
| AgCN | 1.685 | 1.94 |
| AgK(CN)$_2$ | 1.4915 | 1.6035 |
| Calcium cyanamide (CaCN$_2$) | 1.60 | 1.95 |
| BBO | 1.540 | 1.655 |

Schematically illustrated in FIG. 1 are two light rays 210 and 220 passing the optical element 110 and the reticle 120. The s-component of the light rays 210, 220 (having the electric field vector oscillating perpendicular to the plane of incidence of light rays 210, 220) is illustrated by thick dots, whereas the p-component of the light rays 210, 220 (having the electric field vector oscillating parallel to the plane of incidence of light rays 210, 220) is illustrated by short lines.

As can be seen in FIG. 1, the parts 210a, 220a of light rays 210, 220 entering the light entrance side 110a of the optical element 110 comprise both the s-component and the p-component, whereas the parts 210b, 220b of light rays 210, 220 leaving the light exit side 10b of the optical element 110 to arrive at the reticle 120 substantially comprise only the s-component. This effect is due to the relatively much stronger absorption of the p-component if compared to the s-component as explained above with respect to FIG. 2.

Figure 3:
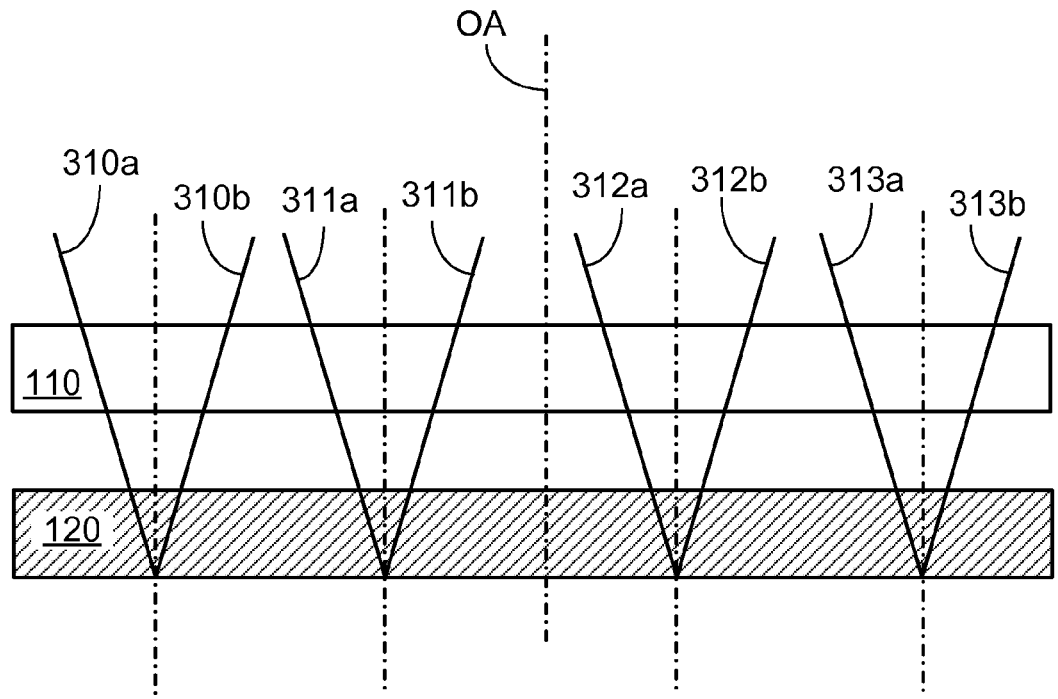
FIG. 3 is a schematic diagram that shows an arrangement of an optical element used according to the present invention.

In FIG. 1 the position of the optical element 110 has been shown such that the optical element is the last element before the reticle. More generally, in order to achieve a uniform polarization distribution at the exit side of the optical element 110, the optical element 110 is advantageously positioned where an optical path of the optical system is at least substantially telecentric. With other words, the optical element 110 should be arranged at a position where the light ray bundles are, at the entrance side of the optical element, with their respective central ray perpendicular to the entrance side of the optical element 110, as schematically illustrated in FIG. 3. In FIG. 3, the marginal rays 310a-313a and 310b-313b of each one of 4 light ray bundles passing the optical element 110 and the reticle 120 are schematically shown. Since the light ray bundles are rotational symmetric with respect to a surface normal of the optical element 110, a rotationally symmetric influence of the optical element 110 on the s-and p-polarized components is achieved.

Concerning such positions of the optical element 110, it has however to be noted that in some, in particular catadioptric designs of projection lenses the light path significantly deviates from a telecentric light path. If the optical element 110 is to be arranged at a position within the optical system where the optical path is not telecentric, one or more suitable correction elements that provide for an at least substantially telecentric light path within the optical element may be combined with the optical element 110.

Figure 4:
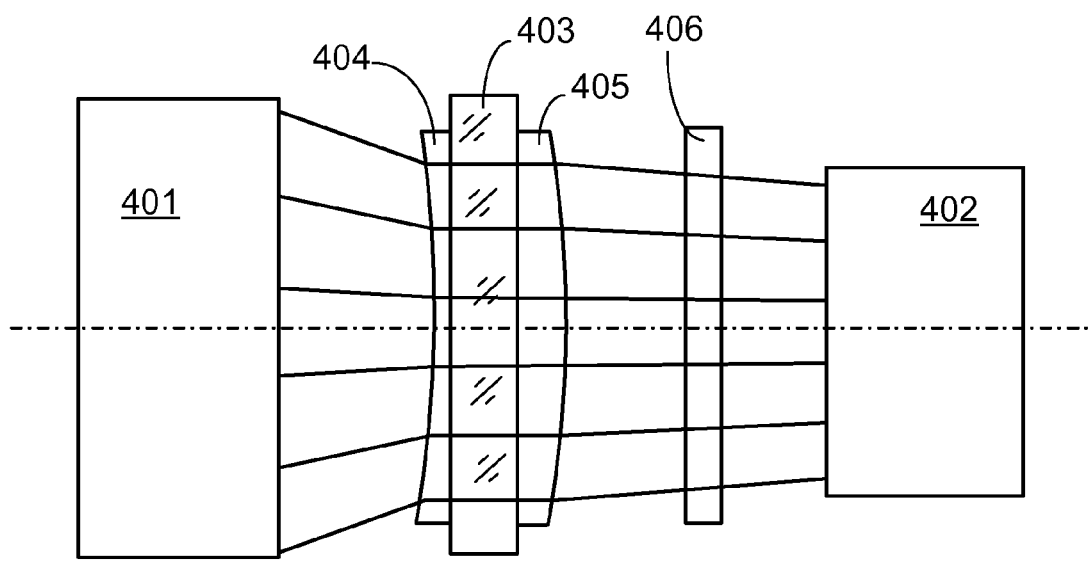
FIG. 4 is a schematic diagram that shows an arrangement in an optical system.

An exemplary embodiment is illustrated in FIG. 4, showing an optical element 403 being arranged between a REMA-objective 401 and a reticle 406, the reticle 406 being positioned in an object plane of a catadioptric projection lens 402. The optical element 403 may be of substantially the same as outlined with reference to FIGS. 1 and 2. However, since the optical path is originally not telecentric at the position of the optical element 403, the optical element 403 is provided with correction elements 404 and 405 being in direct contact with the light entrance side or the light exit side, respectively, of the optical element 403, in order to "make" the light path at least substantially telecentric at the position of the optical element 403. Of course the correction elements 404 and 405 can also be arranged separately from the optical element 403; furthermore, more correction elements or only one correction element may be provided. The correction elements 404, 405 can be refractive lens elements (e.g., having at least one optically effective surface that is aspheric).

Figure 5:
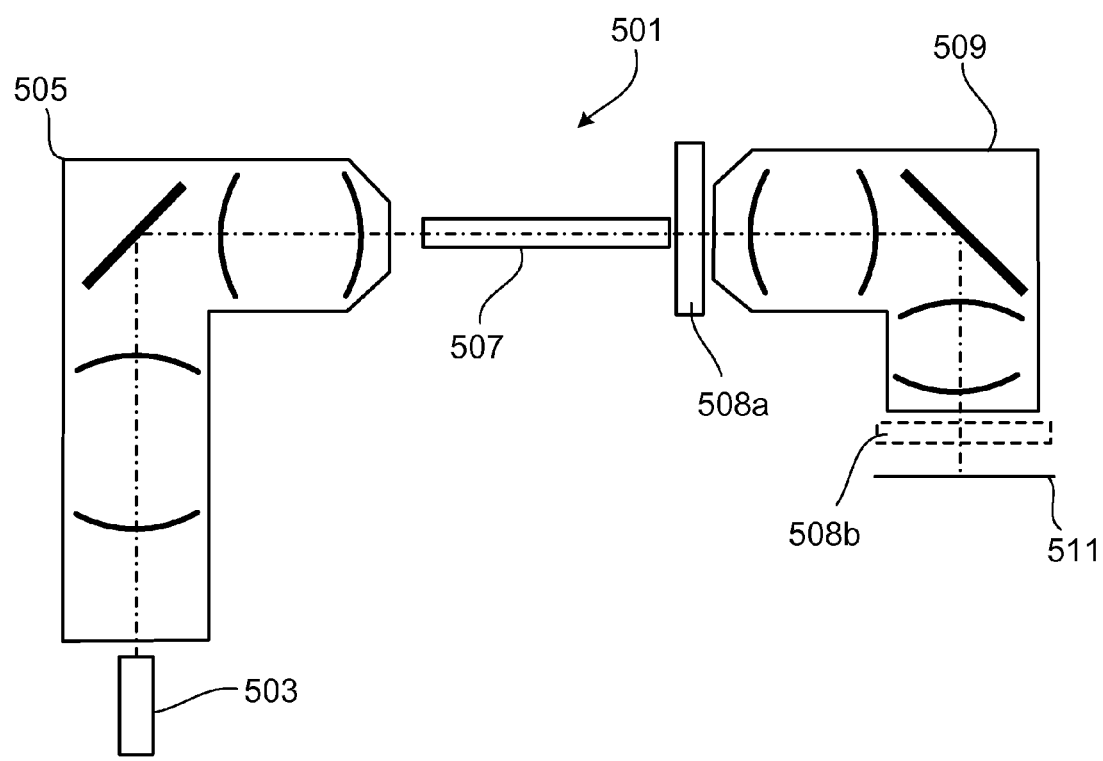
FIG. 5 is a diagram showing an exemplary arrangement in an illumination system according to the present invention.

FIG. 5 represents a schematic view of an embodiment of an illumination system 501 for a microlithography projection apparatus. A collector unit 505 focuses the light of the light source 503 onto an integrator unit 507, which may also be replaced by another suitable light mixing device, e.g. a suitable arrangement of micro-optical elements. The exit surface of the integrator unit 507 is projected through a so-called REMA objective 509 onto the reticle plane 511, which is where the so-called reticle, i.e. the mask carrying the structure, is located in the microlithography projection system. An illumination system of this kind is described in more detail e.g. in U.S. Pat. No. 5,982,558.

Between the light exit side of the integrator unit 507 and the lights entrance side of the REMA objective 509, an optical element 508a is arranged. The optical element 508a may be of substantially the same structure, materials and dimensions as outlined with reference to FIGS. 1 and 2. An advantage of this position is that the dimensions of the optical element 508a may be relatively small. An alternate or additional suitable position of an identical or similar optical element 508b, which can be provided instead of or in addition to the optical element 508a, is illustrated with dashed lines between the light exit side of the REMA objective 509 and the reticle 511. An advantage of this position is that the inventive "refreshing" of the polarization state is performed after a relatively large number of optical elements have been passed by the illumination light in the illumination system 501 and before the illumination light enters into the projection lens. However, it should be noted that this position (shown for the optical element 508b) also requires a relatively large crystal quality and well-defined geometrical conditions due to the relatively small distance to the object, in order to prevent for a possible deterioration of the imaging quality due to impurities in the crystal materials of the optical element 508b etc. The region where the optical element 508a and/or 508b is placed can be flushed with a suitable medium (e.g. helium gas) in order to provide for stable temperature conditions.

Figure 6:
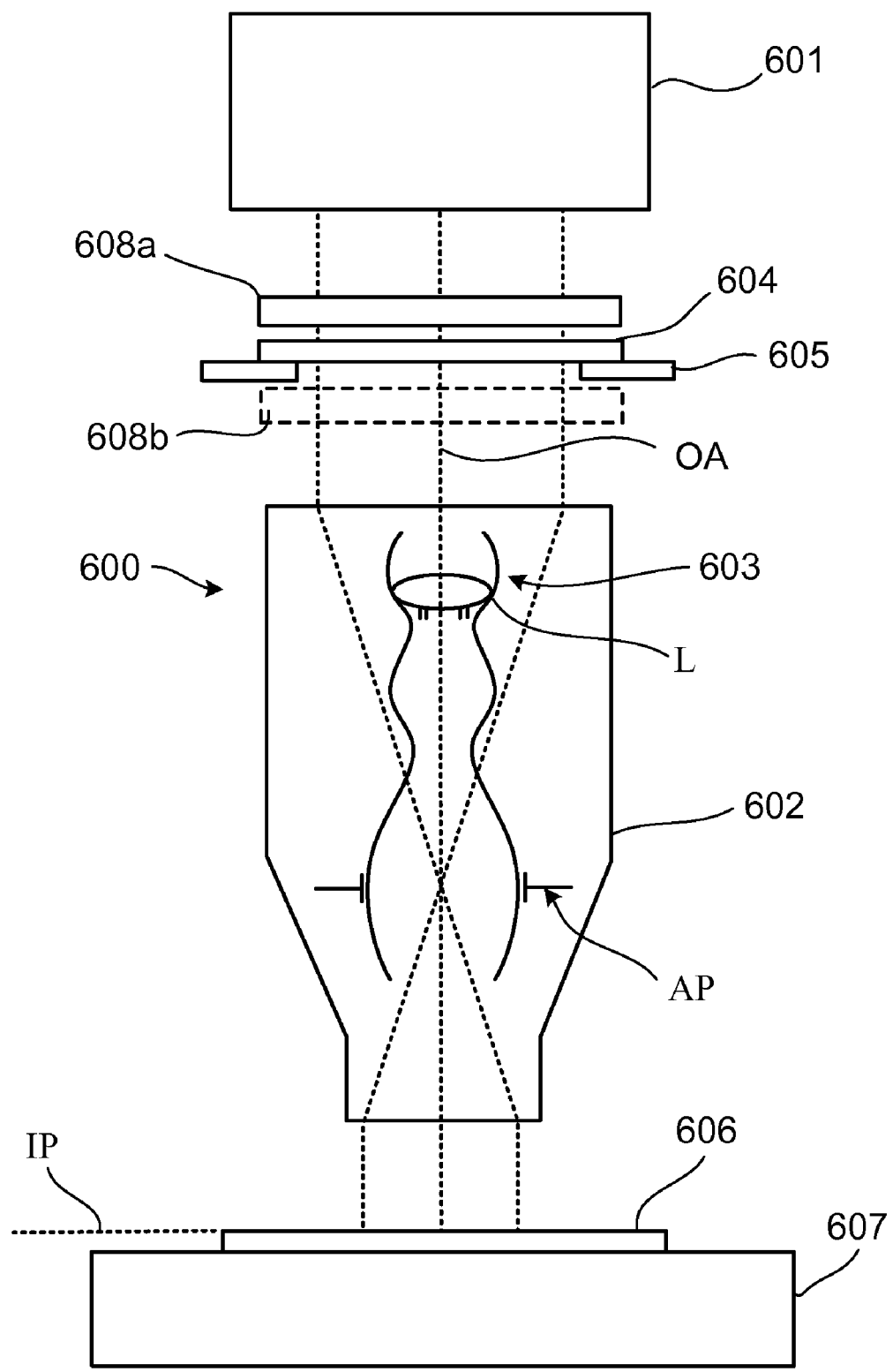
FIG. 6 is a diagram showing an exemplary arrangement in a microlithographic exposure system according to the present invention.

FIG. 6 illustrates the principal arrangement of a microlithography projection apparatus 600. The projection apparatus 600 comprises an illumination system 601 (like the illumination system 501 which has been exemplified by FIG. 5), a reticle 604, a reticle support unit 605, a projection lens 602, a light sensitive substrate 606 and a support unit 607 for the substrate 606. The illumination system 601 illuminates an area in the object plane of the projection lens 602, which comprises an arrangement of lenses L (and/or mirrors), the arrangement being symbolized by "603", and an aperture stop "AP". The reticle 604 which is positioned in the light path by means of the reticle support unit 605 is arranged in the object plane of the projection lens 602. The reticle 604 of the kind that is used in microlithography has a structure with detail dimensions in the range of micrometers and nanometers. The reticle 604 can be e.g. a structured mask, a programmable mirror array or a programmable LCD array. The structure of the reticle 604 or a part of this structure is projected by means of the projection lens 602 onto the light-sensitive substrate 606, which is arranged in the image plane of the projection lens 602. The light-sensitive substrate 606 is held in position by the wafer support unit 607. The light-sensitive substrate 606 is typically a silicon wafer that has been coated with a layer of a radiation sensitive material, the resist. The minimum size of the structural details that can be resolved in the projection depends on the wavelength X of the light used for illumination, and also on the numerical aperture on the image side of the projection lens 602.

As can also be seen in FIG. 6, an optical element 608a is arranged before the light entrance side of the reticle 604. The optical element 608a may be of substantially the same structure, materials and dimensions as outlined with reference to FIGS. 1 and 2. An alternate or additional suitable position of an identical or similar optical element 608b, which can be provided instead of or in addition to the optical element 608a, is illustrated with dashed lines between the light exit side of the reticle 604 and the light entrance side of the projection lens 602.

The one or more optical elements 508a, 508b, 608a, 608b, ... used according to the present invention may be rotatably fixed in the optical system, in order to average the effects caused by possible impurities in the crystal material of the optical elements 508a, 508b, 608a, 608b, ... and thereby prevent for a deterioration of the image quality caused by such impurities.

In order to achieve a refreshing of the tangential polarization state without having much of intensity losses, it is advantageous to perform the inventive refreshing at more than one suited positions (e.g., at a plurality of suited positions) in the optical system. Accordingly, in some embodiments, two or more optical elements are provided at different predetermined positions in the optical system, with each of the optical elements being of substantially the structure, materials and dimensions as outlined with reference to FIGS. 1 and 2. Further, at least some (e.g., all) of the optical elements are arranged at positions at which an optical path of the optical system is at least substantially telecentric.

While the present invention is particularly advantageous in exposure systems having high numerical apertures, such as an immersion projection system wherein the space between the last image-side lens element and the image plane is immersed in a medium having a refractive index larger than one, making it possible to realize relatively large image-side numerical apertures of NA=1.4 and higher, the invention is of course not restricted thereto and may also be advantageously realized in "dry" projection systems having e.g. numerical apertures of up to 0.8 or higher.

The above description has been given by way of example. A person skilled in the art will, however, not only understand the disclosure and its advantages, but will also find suitable modifications thereof. Therefore, the disclosure is intended to cover all such changes and modifications as far as falling within the spirit and scope of the invention as defined in the appended claims and the equivalents thereof.

The invention claimed is:

1. An optical system having an optical axis, the optical system comprising:

at least one optical element comprising an optically uniaxial material having, for an operating wavelength of the optical system, an ordinary refractive index $n_o$ and an extraordinary refractive index $n_e$, the extraordinary refractive index $n_e$ being larger than the ordinary refractive index $n_o$;

wherein the optical element absorbs, at least for light rays of the operating wavelength entering the optical element with respect to the optical axis under an angle of incidence that lies within a certain angle region, a p-polarized component of the light rays significantly stronger than a s-polarized component of the light rays, and wherein the optical system is a microlithography optical system.

2. The optical system according to claim 1, wherein a difference between the extraordinary refractive index and the ordinary refractive index at the operating wavelength is at least 0.15.

3. The optical system according to claim 1, wherein an optical crystal axis of the optical element is at least substantially parallel to the optical axis of the optical system.

4. The optical system according to claim 1, wherein the optical element is an at least substantially plan-parallel plate.

5. The optical system according to claim 1, wherein the optical element is arranged at a position along the optical axis where an optical path of the optical system is at least substantially telecentric.

6. The optical system according to claim 1, further comprising at least one correction element that provides for an at least substantially telecentric light path within the optical element.

7. The optical system according to claim 6, wherein the at least one correction element is a refractive lens element.

8. The optical system according to claim 6, wherein the at least one correction element has at least one optically effective surface that is aspheric.

9. The optical system according to claim 6, wherein the at least one correction element is in direct contact with the optical element.

10. The optical system according to claim 1, wherein the optical element is arranged in an image plane or an intermediate image plane of the optical system.

11. The optical system according to claim 1, wherein the angle region comprises at least all incident angles with respect to the optical axis being larger than 60°.

12. The optical system according to claim 1, wherein the optical element absorbs at least 90% of the intensity of the p-polarized component.

13. The optical system according to claim 1, wherein the optical element transmits at least 90% of the s-polarized component.

14. The optical system according to claim 1, wherein the uniaxial material comprises an alkali earth metal or alkali metal as a first component and a chemical $N_3$-compound, a chemical NCN-compound or a chemical OCN-compound as a second component.

15. The optical system according to claim 1, wherein the uniaxial material is selected from the group consisting of Potassium Azid ($KN_3$), Calcium Cyanamide ($CaCN_2$) and Sodium Cyanate (NaOCN).

16. The optical system according to claim 1, wherein the uniaxial material is selected from the group consisting of Henotim (Y[$PO_4$]), Bastnäsite ((Ce,La,Nd)[$CO_3F$]), Synchisite (CeCa[($CO_3$)$_2$F], Parisite ((Ce,La)$_2$Ca[($CO_3$)$_3F_2$]$^3$), Röntgenite ($Ce_3Ca_2$[($CO_3$)$_5F_3$], [Pt(CN)$_4$]Mg.7$H_2O$, AgCN, AgK(CN)$_2$, [$NH_4$]$_2$CO and BBO.

17. The optical system according to claim 1, wherein the operating wavelength is less than 250 nm.

18. The optical system according to claim 1, wherein at least two of the optical elements are provided at different predetermined positions in the optical system.

19. The optical system according to claim 18, wherein at least some of the predetermined positions are positions at which an optical path of the optical system is at least substantially telecentric.

20. The optical system according to claim 1, wherein the light passing the optical system has, at the light entrance side of the optical element, an at least approximate tangential polarization distribution.

21. The optical system according to claim 1, wherein the optical element is rotatably mounted around the optical axis.

22. The optical system according to claim 1, wherein a space between a last optical element of the optical system and an image plane of the optical system includes an immersion medium having a refractive index n larger than 1.

23. The optical system according to claim 1, wherein an image-side numerical aperture NA of the optical system has a value of at least 0.8.

24. The optical system according to claim 1, wherein the optical system is an illumination system for a microlithographic projection exposure apparatus comprising a light source and a plurality of optical elements through which a reticle plane is illuminated with light being emitted from the light source, wherein the optical element is the element that is most proximate to the reticle plane.

25. The optical system according to claim 1, wherein the optical system is an illumination system for a microlithographic projection exposure apparatus comprising along the optical axis a light source, a light mixing device and a REMA-projection lens projecting a variable masking onto a reticle plane, and wherein the optical element is arranged between the REMA-projection lens and the reticle plane.

26. The optical system according to claim 1, wherein the optical system is a microlithographic projection exposure apparatus comprising an illumination system and a projection lens, wherein the illumination system illuminates a reticle being arranged in an object plane of the projection lens with light, and wherein the projection lens images the reticle onto an image plane of the projection lens.

27. The optical system according to claim 26, wherein the optical element is arranged between the reticle and the projection lens.

28. A method, comprising:
using the system of claim 1 for microlithographic projection exposure.

29. A method of microlithographic structuring a substrate, comprising: illuminating a mask with light and projecting an image of the mask onto the substrate, wherein the illuminating the mask with light and/or the step of projecting an image of the mask onto the substrate uses an optical system according to claim 1.

* * * * *

UNITED STATES PATENT AND TRADEMARK OFFICE
CERTIFICATE OF CORRECTION

PATENT NO.        : 7,764,427 B2                                                    Page 1 of 1
APPLICATION NO.   : 11/614536
DATED             : July 27, 2010
INVENTOR(S)       : Karl-Heinz Schuster It is certified that error appears in the above-identified patent and that said Letters Patent is hereby corrected as shown below:

Column 2,
Line 53, delete "plan-parallel" and insert --plane-parallel--,

Column 3,
Line 39, delete "Henotim" and insert --Xenotime--,

Column 3,
Line 43, delete "Azid" and insert --Azide--,

Column 4,
Line 54, delete "plan-parallel" and insert --plane-parallel--,

Column 6,
Line 14 (Table 1), delete "Henotim" and insert --Xenotime--,

Column 6,
Line 18 (Table 1), delete "Azid" and insert --Azide--,

Column 6,
Line 38, delete "10b" and insert --110b--,

Column 9,
Line 23, delete "plan-parallel" and insert --plane-parallel--,

Column 9,
Line 59, delete "Azid" and insert --Azide--,

Column 10,
Line 1, delete "Henotim" and insert --Xenotime--,

Signed and Sealed this

Twelfth Day of October, 2010

David J. Kappos
*Director of the United States Patent and Trademark Office*